US006960868B2

(12) United States Patent
Ishimasa et al.

(10) Patent No.: US 6,960,868 B2
(45) Date of Patent: Nov. 1, 2005

(54) PIEZOELECTRIC ELECTRO-ACOUSTIC TRANSDUCER AND MANUFACTURING METHOD OF THE SAME

(75) Inventors: Mitsunori Ishimasa, Toyama (JP); Keiichi Kami, Toyama (JP); Tetsuo Takeshima, Toyama (JP); Yuk Yokoi, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/759,110

(22) Filed: Jan. 20, 2004

(65) Prior Publication Data

US 2004/0195941 A1 Oct. 7, 2004

(30) Foreign Application Priority Data

Apr. 7, 2003 (JP) ............................ 2003-102438

(51) Int. Cl.[7] ............................................ H01L 41/08
(52) U.S. Cl. ...................... 310/324; 310/348; 310/345
(58) Field of Search ................................ 310/324, 332, 310/344, 345, 348

(56) References Cited

U.S. PATENT DOCUMENTS 6,472,798 B2 * 10/2002 Kishimoto .................. 310/344
6,570,299 B2 * 5/2003 Takeshima et al. ......... 310/348
6,653,762 B2 * 11/2003 Takeshima .................. 310/340
6,794,799 B2 * 9/2004 Takeshima et al. ......... 310/348

FOREIGN PATENT DOCUMENTS

| | | |
|---|---|---|
| JP | 2000-310990 | 11/2000 |
| JP | 2003-009286 | 1/2003 |
| JP | 2003023696 | 1/2003 |

* cited by examiner

*Primary Examiner*—Mark Budd
(74) *Attorney, Agent, or Firm*—Keating & Bennett, LLP

(57) ABSTRACT

A piezoelectric electro-acoustic transducer includes a substantially rectangular piezoelectric diaphragm, a casing having a support unit for supporting four corners of the piezoelectric diaphragm, terminals fixed to the casing such that an internal connection portion of the terminal is exposed in the vicinity of the support unit, a first elastic adhesive for coating between the external periphery of the piezoelectric diaphragm and the internal connection portion of the terminal therewith, a conductive adhesive for coating between electrodes of the piezoelectric diaphragm and the internal connection portion of the terminal via the upper surface of the first elastic adhesive therewith, and a second elastic adhesive for sealing the external periphery of the piezoelectric diaphragm and the internal periphery of the casing, and a cradle provided in the internal periphery of the casing as well as below the piezoelectric diaphragm in the vicinity that is coated with the first elastic adhesive for forming a gap for stopping flow of the first elastic adhesive at a position lower than the support unit as well as between the upper surface of the cradle and the bottom surface of the piezoelectric diaphragm.

10 Claims, 14 Drawing Sheets

PIEZOELECTRIC ELECTRO-ACOUSTIC TRANSDUCER AND MANUFACTURING METHOD OF THE SAME

BACKGROUND OF THE INVENTION

1. Field of the Invention

The present invention relates to a piezoelectric electro-acoustic transducer for a piezoelectric receiver and a piezoelectric sounder.

2. Description of the Related Art

Piezoelectric electro-acoustic transducers have been widely used for piezoelectric sounders and piezoelectric receivers that produce an alarm sound or an operating sound in electronic instruments, home electric appliances, and portable telephones. In such a piezoelectric electro-acoustic transducer, a transducer has been proposed which improves productivity and acoustic conversion efficiency and which is miniaturized by using a rectangular diaphragm.

In Japanese Unexamined Patent Application Publication No. 2000-310990, a piezoelectric electro-acoustic transducer is disclosed that includes a rectangular piezoelectric diaphragm and a casing having a bottom wall, four sidewalls, a support unit for supporting the diaphragm inside two sidewalls opposing each other, and first and second terminals disposed in the support unit for connecting to the outside, wherein the diaphragm is accommodated within the casing, and two sides of the diaphragm opposing each other are fixed to the support unit via an adhesive or an elastic adhesive while the clearance between the remaining two sides of the diaphragm and the casing is sealed with the elastic adhesive and the diaphragm and the first and second terminals are electrically connected via a conductive adhesive.

The reason for sealing the space between the diaphragm and the casing is to isolate spaces on the top and bottom surfaces of the diaphragm so as to provide acoustic spaces on the top and bottom surfaces of the diaphragm. To minimize the suppression of the vibration of the diaphragm, a soft elastic adhesive, such as a silicone adhesive, is used as the elastic adhesive.

To reduce the frequency, recently, the thickness of the diaphragm has been greatly reduced, and thin diaphragms with a thickness of about several tens to one hundred micrometers are used. With such a thin diaphragm, the effect of the support structure on frequency characteristic is increased.

For example, if the diaphragm is directly connected to the terminals fixed to the casing with a thermo-setting conductive adhesive, the diaphragm is stressed by a curing contraction force of the conductive adhesive, which produces dispersion in frequency characteristics. Also, since a Young's modulus of the conductive adhesive after being cured is relatively large, the vibration of the diaphragm is suppressed and cracks are produced in the conductive adhesive by the vibration of the diaphragm.

Japanese Unexamined Patent Application Publication No. 2003-9286 discloses a piezoelectric electro-acoustic transducer that includes a casing having a support unit for supporting lower surfaces of two or four sides of a piezoelectric diaphragm, terminals having internal connection portions exposed in the vicinities of the support unit, a first elastic adhesive applied between the external periphery of the piezoelectric diaphragm and the internal connection portions of the terminals so as to fix the piezoelectric diaphragm to the casing, a conductive adhesive applied between an electrode of the piezoelectric diaphragm and the internal connection portions of the terminals so as to be spaced from the upper surface of the first elastic adhesive and to electrically connect the electrode of the piezoelectric diaphragm to the internal connection portions of the terminals, and a second elastic adhesive for sealing the clearance between the external periphery of the piezoelectric diaphragm and the internal periphery of the casing.

The first elastic adhesive may be a urethane adhesive, for example, and the second elastic adhesive is a material having a smaller Young's modulus than that of the first elastic adhesive, such as a silicone adhesive.

FIG. 13 shows a connection portion between a piezoelectric diaphragm 30 and a terminal 31 in Japanese Unexamined Patent Application Publication No. 2003-9286. Between the piezoelectric diaphragm 30 and the terminal 31, a first elastic adhesive 32 is applied so as to rise and a conductive adhesive 33 is further applied thereon so as to prevent changes in frequency characteristics of the diaphragm 30 due to a curing contraction stress of the conductive adhesive 33, and to avoid cracks being generated after the conductive adhesive 33 is cured.

However, in this case, a support unit 34 and the piezoelectric diaphragm 30 are bonded by the first elastic adhesive 32, such that the diaphragm 30 is restricted and the vibration thereof is suppressed.

In Japanese Unexamined Patent Application Publication No. 2003-23696, a transducer is disclosed which includes a support unit provided in a casing for supporting four corner lower surfaces of a piezoelectric diaphragm, and between the piezoelectric diaphragm and a terminal, a first elastic adhesive is applied at a location in the vicinity of the support unit and a conductive adhesive is further applied thereon.

FIG. 14 shows a connection portion between the piezoelectric diaphragm 30 and the terminal 31 in Japanese Unexamined Patent Application Publication No. 2003-23696. In this case, since a cavity is provided under the piezoelectric diaphragm 30 in a region where the first elastic adhesive 32 is applied, although it is unlikely that the piezoelectric diaphragm 30 will be restricted by the first elastic adhesive 32, the first elastic adhesive 32 flows downward passing through the clearance between the diaphragm 30 and a casing 35, such that the first elastic adhesive 32 is not raised between the diaphragm 30 and the terminal 31.

The elastic adhesive is typically a cold-setting adhesive and a thermo-setting adhesive. In the cold-setting adhesive, since the viscosity in coating (thixotropy) is relatively large and the curing time is short, the adhesive cannot flow downward passing through the clearance between the diaphragm and the casing. However, the cold-setting adhesive begins to cure during coating which deteriorates work efficiency by the clogging a coating device. The Young's modulus after the adhesive is cured is relatively high such that the cold-setting adhesive restricts the diaphragm.

On the other hand, in the thermo-setting adhesive with a low viscosity (thixotropy), the adhesive does not begin curing during coating such that coating work efficiency is outstanding, and the diaphragm is not restricted because the Young's modulus after being cured is relatively low.

However, if the low-viscosity elastic adhesive is used, the elastic adhesive flows down toward the bottom wall of the casing as described above and the elastic adhesive cannot be raised between the diaphragm and the terminal. Therefore, a restricting force of the conductive adhesive which will be applied and cured thereafter may act on the diaphragm so as to inhibit the vibration.

As described above, with a conventional structure, it is difficult to simultaneously satisfy three conditions: 1) the diaphragm being held without substantial restriction, 2) coating work efficiency of the elastic adhesive is improved, and 3) the elastic adhesive being applied so as to rise.

SUMMARY OF THE INVENTION

To overcome the problems described above, preferred embodiments of the present invention provide a piezoelectric electro-acoustic transducer in which frequency characteristics of a diaphragm are stable and coating work efficiency of an elastic adhesive is outstanding.

According to a first preferred embodiment of the present invention, a piezoelectric electro-acoustic transducer includes a substantially rectangular piezoelectric diaphragm that vibrates in the surface-flexural mode in the thickness direction of the diaphragm by applying an alternating signal between electrodes, a casing having a support unit disposed in the internal periphery for supporting four corners of the piezoelectric diaphragm, a terminal fixed to the casing such that an internal connection portion of the terminal is exposed in the vicinity of the support unit, a first elastic adhesive for fixing the piezoelectric diaphragm to the casing by applying the first elastic adhesive between the external periphery of the piezoelectric diaphragm and the internal connection portion, a conductive adhesive for electrically connecting the electrodes of the piezoelectric diaphragm to the internal connection portion of the terminal by applying the conductive adhesive between the electrode of the piezoelectric diaphragm and the internal connection portion of the terminal via the upper surface of the first elastic adhesive, and a second elastic adhesive for sealing a gap between the external periphery of the piezoelectric diaphragm and the internal periphery of the casing, wherein a cradle is provided in the internal periphery of the casing and below the piezoelectric diaphragm in the vicinity of the portion that is coated with the first elastic adhesive for forming a gap to prevent a flow of the first elastic adhesive at a position lower than the support unit as well as between the upper surface of the cradle and the bottom surface of the piezoelectric diaphragm.

According to a second preferred embodiment of the present invention, a method for manufacturing a piezoelectric electro-acoustic transducer is provided which includes the steps of preparing a rectangular piezoelectric diaphragm that vibrates in the surface-flexural mode in the thickness direction of the diaphragm by applying an alternating signal between electrodes, preparing a casing having a support unit disposed in the internal periphery for supporting four corners of the piezoelectric diaphragm, a cradle provided in the vicinity of the support unit and at a position lower than the support unit for stopping a flow of a first elastic adhesive, and a terminal fixed to the casing such that an internal connection portion of the terminal is exposed in the vicinity of the support unit, fixing the piezoelectric diaphragm disposed within the external periphery of the internal connection portion to the casing by applying the first elastic adhesive between the piezoelectric diaphragm and the internal connection portion so as to be cured, electrically connecting electrodes of the piezoelectric diaphragm to the internal connection portion of the terminal by applying a conductive adhesive between an electrode of the piezoelectric diaphragm and the internal connection portion of the terminal via the upper surface of the first elastic adhesive so as to be cured, and sealing a gap between the external periphery of the piezoelectric diaphragm and the internal periphery of the casing by applying a second elastic adhesive between the external periphery of the piezoelectric diaphragm and the internal periphery of the casing so as to be cured.

To improve coating work efficiency while supporting the diaphragm without substantial restrictions, the first elastic adhesive preferably has a low viscosity. If the first low viscosity elastic adhesive is applied between the periphery of the diaphragm and the internal surface of the casing, the elastic adhesive would flow down toward the bottom wall of the casing passing through the clearance between the diaphragm and the casing. However, a cradle is provided under the piezoelectric diaphragm in the coating region of the first elastic adhesive, such that the first elastic adhesive flows into the clearance between the cradle and the diaphragm, thereby preventing the flowing by a surface tension of the first elastic adhesive and preventing the first elastic adhesive from flowing down toward the bottom wall of the casing. Moreover, since the clearance between the cradle and the diaphragm is set to be small such that the clearance is rapidly filled with the adhesive, excess adhesive rises. Therefore, after the first elastic adhesive is cured, when the conductive adhesive is applied thereon, a curing contraction force of the conductive adhesive is alleviated by the first elastic adhesive because the conductive adhesive detours from the shortest route between the electrode of the diaphragm and the internal connection portion of the terminal. As a result, the distortion of the diaphragm is effectively prevented, thereby stabilizing frequency characteristics while the conductive adhesive is prevented from cracking caused by the vibration of the diaphragm.

Preferably, the casing is provided with a groove disposed in the internal periphery for receiving the second elastic adhesive, and an anti-flowing wall is disposed at a position lower than the support unit within the internal periphery of the groove to restrict the second elastic adhesive from flowing toward the bottom wall of the casing.

The second elastic adhesive may be a low viscosity adhesive similar to the first elastic adhesive. If a low viscosity elastic adhesive is applied between the periphery of the diaphragm and the internal surface of the casing, the elastic adhesive would flow down toward the bottom wall of the casing passing through the clearance between the diaphragm and the casing. However, the second elastic adhesive flows into the groove provided in the casing and is further dammed by the anti-flowing wall provided in the internal periphery, preventing the elastic adhesive from flowing down toward the bottom wall of the casing. Also, the second elastic adhesive rapidly flows along the groove, which enables the periphery of the diaphragm to be easily sealed.

The height of the anti-flowing wall is set at a height at which the second elastic adhesive cannot flow toward the bottom wall of the casing through the clearance between the wall and the diaphragm by a surface tension of the second elastic adhesive while the vibration of the diaphragm is not restricted.

The height of the anti-flowing wall for the second elastic adhesive may be the same as that of the cradle for stopping the flow of the first elastic adhesive. However, the height of the wall is preferably set to be lower than that of the cradle.

While the cradles are formed at locations where the piezoelectric diaphragm opposes the terminal, i.e., in vicinities of four corners of the piezoelectric diaphragm, the anti-flowing walls are provided around substantially the entire periphery of the piezoelectric diaphragm, such that if the heights are the same, the film thickness of the second elastic adhesive between the anti-flowing wall and the piezoelectric diaphragm is reduced, such the vibration of the diaphragm may be suppressed by the restricting force. By setting the height of the anti-flowing wall lower than that of the cradle, within the range that the second elastic adhesive cannot flow out of the clearance between the anti-flowing wall and the piezoelectric diaphragm, the film thickness of the second elastic adhesive may be increased so as to provide secure sealing while not substantially increasing the restricting force of the second elastic adhesive.

Preferably, the first elastic adhesive has a Young's modulus of about $500\times10^6$ Pa or less after being cured while the second elastic adhesive has a Young's modulus of about $30\times10^6$ Pa or less after being cured.

That is, the Young's modulus of the first and second elastic adhesives after being cured is set such that the displacement of the diaphragm is not substantially affected, and when the Young's modulus of the first elastic adhesive is set to about $500\times10^6$ Pa or less after being cured while the Young's modulus of the second elastic adhesive is set to about $30\times10^6$ Pa or less after being cured, the displacement of the diaphragm is increased to about 90% or more of the maximum value, thus eliminating large influences on the displacement of the diaphragm.

The Young's modulus of the second elastic adhesive is set to be relatively low because, while the first elastic adhesive is partly applied in vicinities of four corners of the piezoelectric diaphragm, the second elastic adhesive is applied at the periphery of the piezoelectric diaphragm, such that the piezoelectric diaphragm is more severely affected by the Young's modulus of the second elastic adhesive.

Preferably, the first elastic adhesive is a urethane adhesive and the second elastic adhesive is a silicone adhesive.

As the elastic adhesive, a silicone adhesive is commonly used because of the low Young's modulus after being cured and the low cost. However, the silicone adhesive has a severe problem in that siloxane gas is generated during heating and curing which adheres to a conductive part as a film causing adhesion failure and conduction failure when the conductive adhesive is applied. Therefore, the silicone adhesive is not applied after the application and curing of the conductive adhesive. On the other hand, the urethane adhesive does not produce the problems which are produced by the silicone adhesive.

Thus, a urethane is preferably used for the first elastic adhesive for holding the piezoelectric diaphragm to the casing as a primer of the conductive adhesive for conducting between the electrode of the piezoelectric diaphragm and the internal connection portion of the terminal, and a silicone adhesive is used for the second elastic adhesive for sealing the periphery of the piezoelectric diaphragm. Thereby, a piezoelectric electro-acoustic transducer having outstanding vibration characteristics is obtained without causing adhesion failure and conduction failure.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Figure 1:
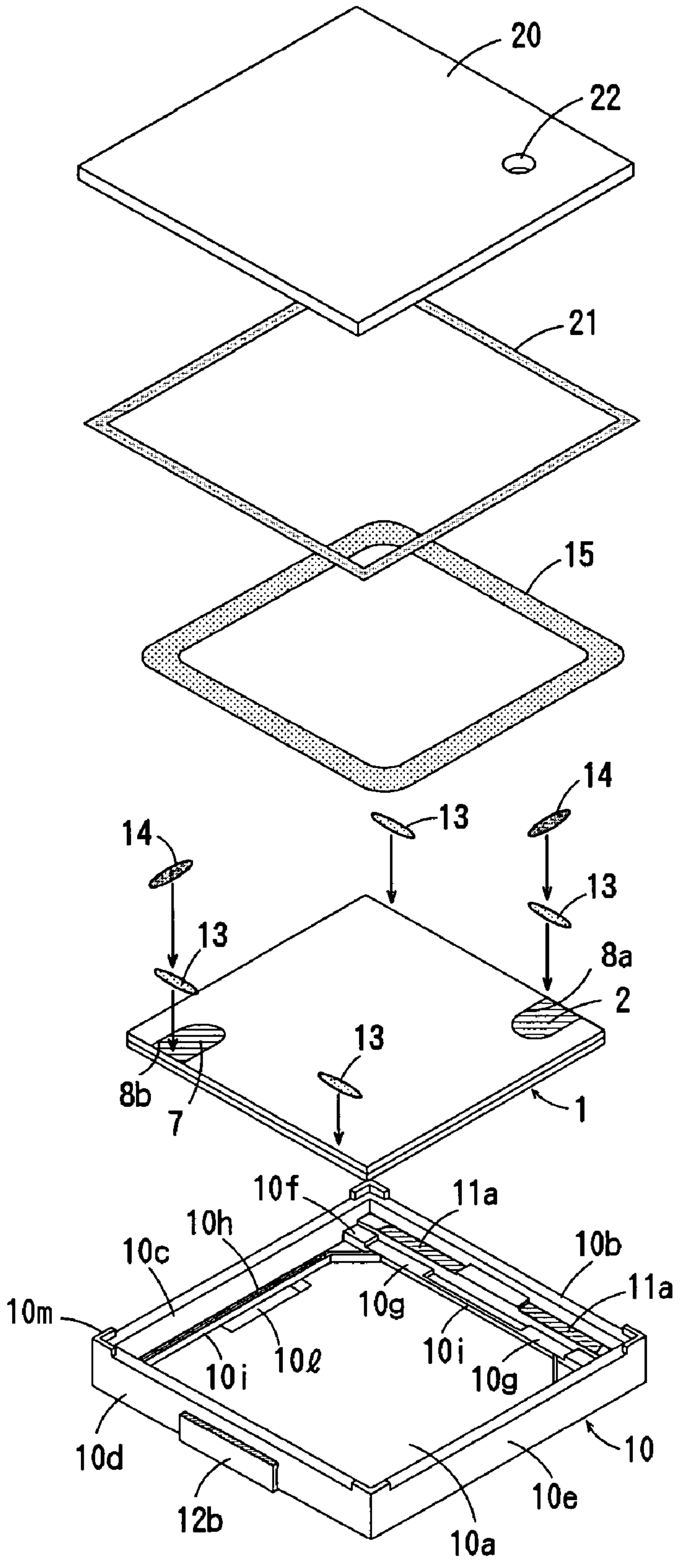
FIG. 1 is an exploded perspective view a piezoelectric electro-acoustic transducer according to a first preferred embodiment of the present invention.

FIG. 1 shows an example of a piezoelectric electro-acoustic transducer according to a preferred embodiment of the present invention.

A piezoelectric electro-acoustic transducer according to a preferred embodiment is suitable for instruments with wide-range frequencies such as a piezoelectric receiver and includes a piezoelectric diaphragm 1 having a layered structure, a case 10, and a lid 20. The case 10 and the lid 20 define a casing.

Figure 2:
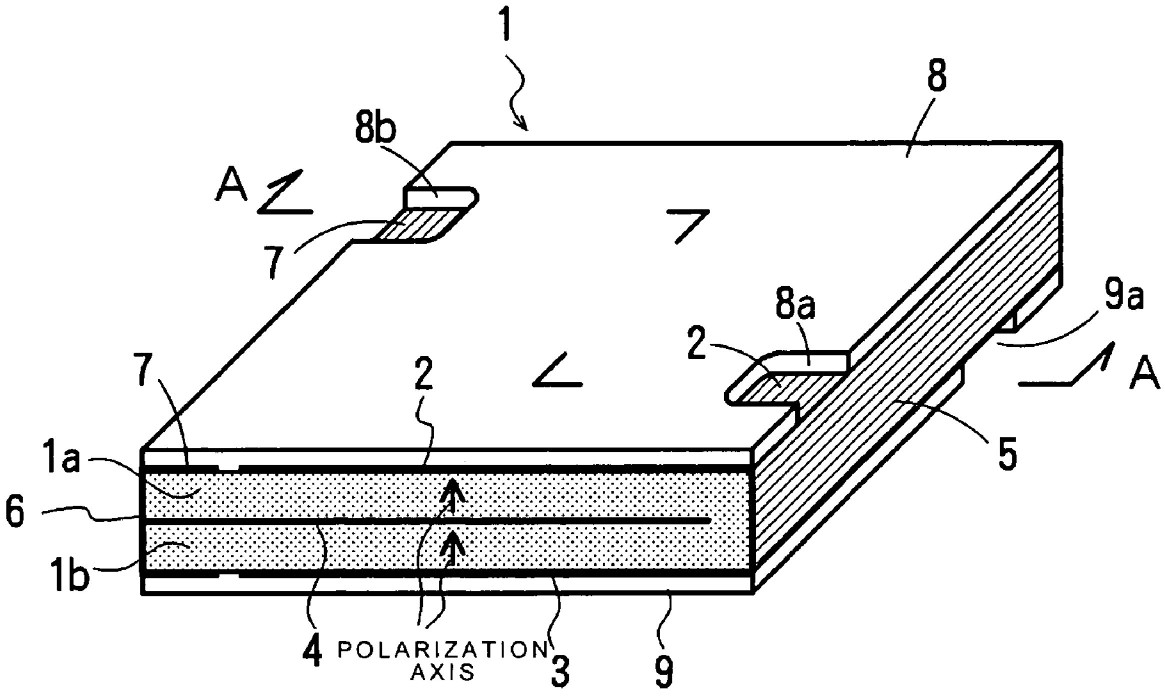
FIG. 2 is a perspective view of a piezoelectric diaphragm used in the piezoelectric electro-acoustic transducer shown in FIG. 1.
Figure 3:
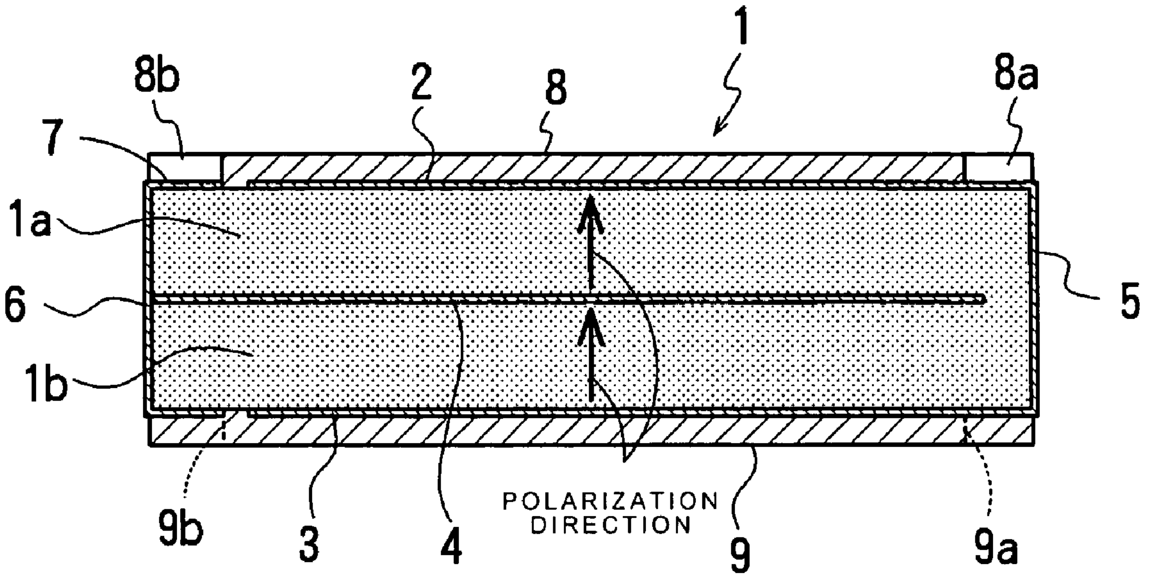
FIG. 3 is a step sectional view at the line A—A of FIG. 2.
Figure 4:
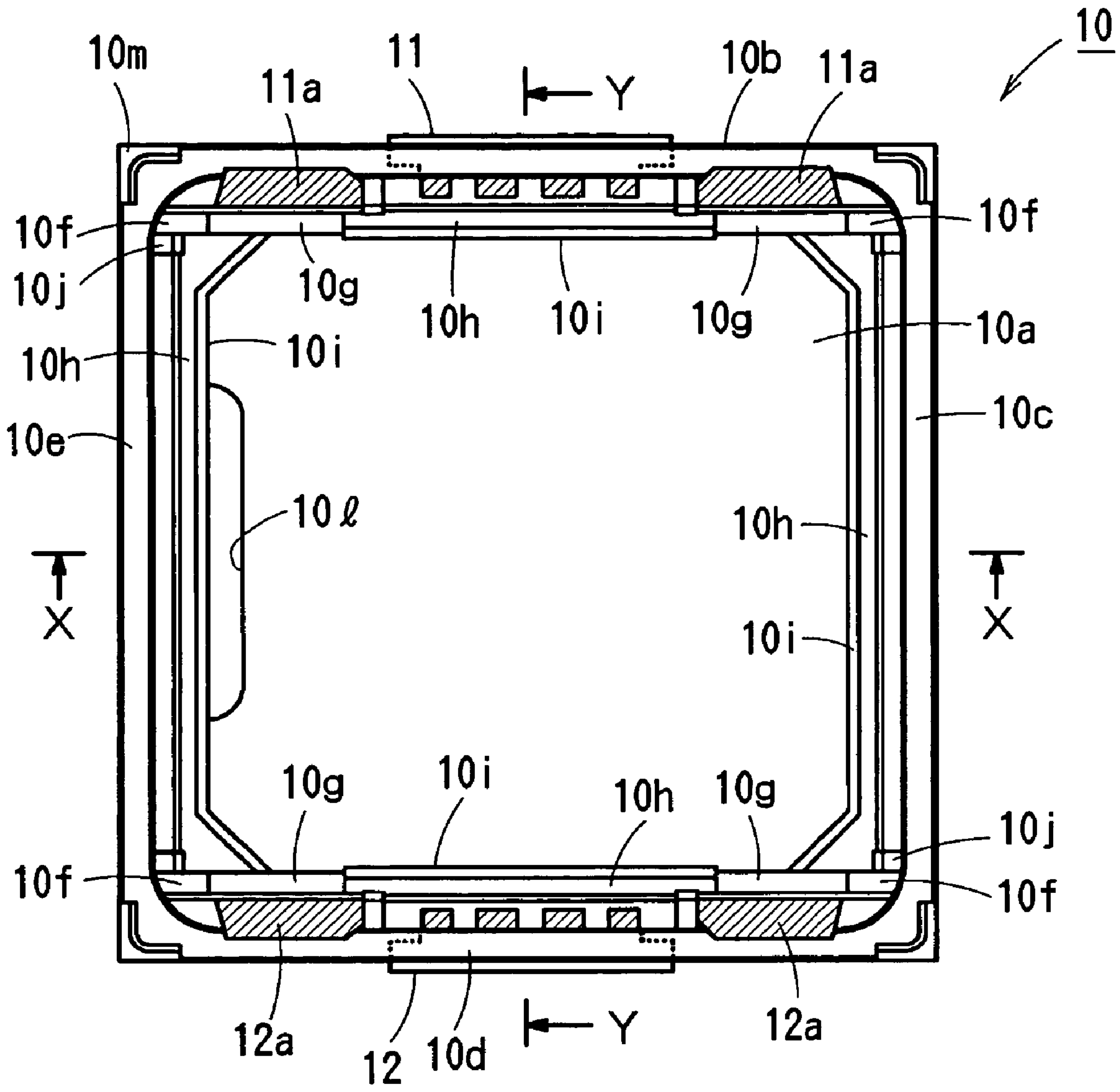
FIG. 4 is a plan view of a case used in the piezoelectric electro-acoustic transducer shown in FIG. 1.
Figure 5:
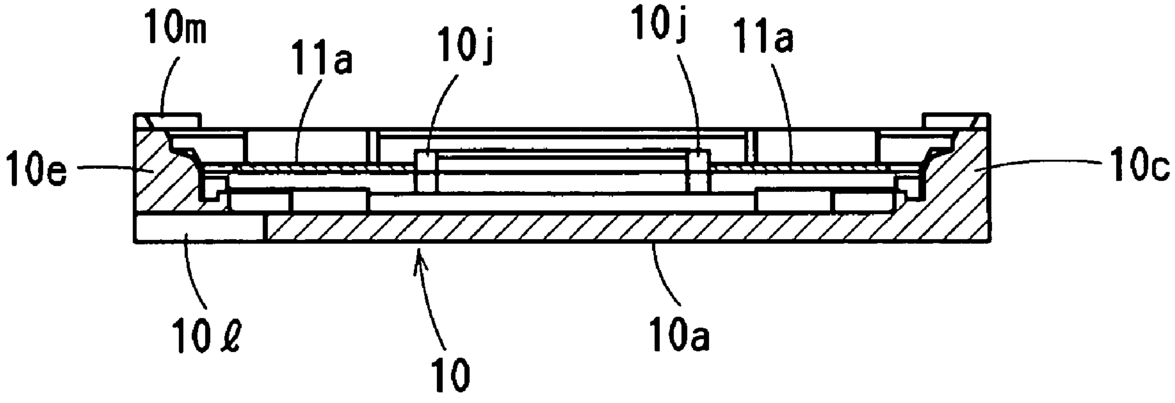
FIG. 5 is a sectional view along the line X—X of FIG. 4.
Figure 6:
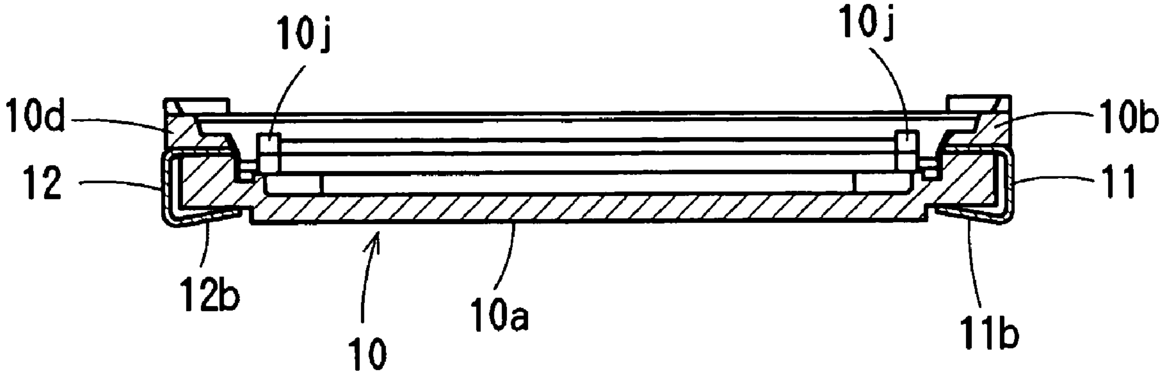
FIG. 6 is a sectional view along the line Y—Y of FIG. 4.

The diaphragm 1, as shown in FIGS. 2 and 3, is preferably formed by depositing two piezoelectric ceramic layers 1*a* and 1*b*. The principal top/bottom surfaces of the diaphragm 1 are provided with principal-plane electrodes 2 and 3, and between the ceramic layers la and 1*b*, an internal electrode 4 is provided. The two ceramic layers 1*a* and 1*b*, as shown by the thick-line arrow of the drawings, are polarized in the same thickness direction. The top principal-plane electrode 2 and the bottom principal-plane electrode 3 are slightly smaller in length than the side length of the diaphragm 1, and one end of each of the electrodes 2 and 3 is connected to an end surface electrode 5 provided on one end surface of the diaphragm 1. Therefore, the top/bottom principal-plane electrodes 2 and 3 are connected with each other. The internal electrode 4 is substantially symmetrical with the principal-plane electrodes 2 and 3, and one end of the internal electrode 4 is separated from the end surface electrode 5 while the other end is connected to an end surface electrode 6 provided on the other end surface of the diaphragm 1. On the top and bottom surfaces of the other end surface of the diaphragm 1, auxiliary electrodes 7 are arranged so as to conduct to the end surface electrode 6.

On the top and bottom surfaces of the diaphragm 1, resin layers 8 and 9 are arranged cover the principal-plane electrodes 2 and 3.

The resin layers 8 and 9 are protection layers provided for preventing cracking of the diaphragm 1 due to dropping shock. In the vicinity of diagonal corners of the diaphragm 1, the top and bottom resin layers 8 and 9 are provided with cut-outs 8*a* and 9*a*, on which the principal-plane electrodes 2 and 3 are exposed, and cut-outs 8*b* and 9*b*, on which the auxiliary electrodes 7 are exposed.

Although the cut-outs 8*a*, 8*b*, 9*a*, and 9*b* may be arranged on one of top and bottom surfaces, according to the present preferred embodiment, the cut-outs 8*a*, 8*b*, 9*a* and 9*b* are arranged on the top and bottom surfaces so as to eliminate directivity.

Also, the auxiliary electrodes 7 are not necessarily strip electrodes, and may be arranged only at locations corresponding to the cut-outs 8*a* and 9*b*.

According to the preferred embodiment, as the ceramic layers la and 1*b*, PZT ceramics having a size of about 10 mm×about 10 mm×about 40 μm, for example, are preferably used and as the resin layers 8 and 9, a polyamidoimide resin with a thickness of about 3 to about 10 μm, for example, is preferably used.

The case 10, as shown in FIGS. 4 to 10, preferably has a resin substantially rectangular box-shape with a bottom wall 10*a* and four sidewalls 10*b* to 10*e*. Preferred resin materials may be heat-resistant resins such as an LCP (liquid crystal polymer), SPS (syndiotactic polystyrene), PPS (polyphenylene sulfide), and an epoxy resin. Inside two opposing sidewalls 10*b* and 10*d* of the four sidewalls 10*b* to 10*e*, forked internal connection portions 11 a and 12*a* of terminals 11 and 12 are exposed. The terminals 11 and 12 are insert-molded into the case 10. External connection portions 11*b* and 12*b*, which are exposed outside, of the terminals 11 and 12 are bent to extend to the bottom surface of the case 10 along the sidewalls 10*b* and 10*d* (see FIG. 6).

At four corners inside the case 10, support portions 10*f* are provided for supporting corner bottom-surfaces of the diaphragm 1. The support portions 10*f* are arranged lower than the exposed surfaces of the internal connection portions 11*a* and 12*a* of the terminals 11 and 12. Therefore, when the diaphragm 1 is disposed on the support portions 10*f*, the upper surface of the diaphragm 1 is substantially flush with the upper surfaces of the internal connection portions 11 a and 12*a* of the terminals 11 and 12.

In the vicinities of the support portions 10*f*, cradles 10*g* are provided at a height that is lower than the support portions 10*f* so as to have a desired clearance D1 from the bottom surface of the diaphragm 1. That is, the clearance D1 between the upper surfaces of the cradles 10*g* and the bottom surface of the diaphragm 1 (the upper surfaces of the support portions 10*f*) is set so as to prevent a first elastic adhesive 13, which will be described later, from flowing out by a surface tension of the first elastic adhesive 13. When a viscosity of the first elastic adhesive 13 is about 6 Pa·s to about 10 Pa·s during application, the clearance D1 is preferably about 0.1 mm to about 0.2 mm, for example. According to the preferred embodiment, the clearance D1 is preferably set to about 0.15 mm, for example.

In the periphery of the bottom wall 10*a*, grooves 10*h* are provided for being filled with a second elastic adhesive 15, which will be described later, and inside the grooves 10*h*, anti-flowing walls 10*i* are provided at a height that is lower than the support portions 10*f*. The anti-flowing walls 10*i* prevent the second elastic adhesive 15 from flowing out toward the bottom wall 10*a*, and a clearance D2 between the upper surfaces of the walls 10*i* and the bottom surface of the diaphragm 1 (the upper surfaces of the support portions 10*f*) is set so as to prevent the second elastic adhesive 15 from flowing out by a surface tension of the second elastic adhesive 15. When a viscosity of the second elastic adhesive 15 is about 0.5 Pa·s to about 2.0 Pa·s during application, the clearance D2 is preferably about 0.15 mm to about 0.25 mm. According to the preferred embodiment, the clearance D2 is preferably set to about 0.20 mm, for example.

According to the preferred embodiment, the bottom surfaces of the grooves 10*h* are disposed at a height above the upper surface of the bottom wall 10*a*, and the grooves 10*h* are filled with a relatively small amount of the second elastic adhesive 15, having a shallow depth so as to be rapidly filled. Specifically, a height D3 between the bottom surfaces of the grooves 10*h* and the bottom surface of the diaphragm 1 (the upper surfaces of the support portions 10*f*) is preferably set to about 0.3 mm, for example. The grooves 10*h* and the walls 10*i* are arranged in the periphery of the bottom wall 10*a* other than the cradles 10*g*. Alternatively, the grooves may be continuously provided in the entire periphery of the bottom wall 10*a* via the internal periphery of the cradles 10*g*.

Also, the terminal portions of the grooves 10*h* arranged in contact with the support portions 10*f* and the cradles 10*g* have an increased width as compared to the remaining portions. Therefore, the excessive second elastic adhesive 15 is absorbed by the portions having the increased width, which prevents the second elastic adhesive 15 from overflowing onto the diaphragm 1.

The case 10 is provided with tapered projections 10*j* on the internal surfaces of the sidewalls 10*b* to 10*e* for guiding the four sides of the diaphragm 1.

The case 10 is also provided with a recess 10*k* provided in the internal upper peripheries of the four sidewalls 10*b* to 10*e* for preventing the flow of the second elastic adhesive 15 from climbing up.

A first sound-releasing opening 101 is also provided on the bottom wall 10*a* adjacent to the sidewall 10*e*.

Substantially L-shaped positioning projections 10*m* are provided on the corner top surfaces of the sidewalls 10*b* to 10*e* for supporting the corners of the lid 20. On the internal surface of the projection 10*m*, a tapered surface 10*n* is provided to guide the lid 20.

The diaphragm 1 is accommodated within the case 10, and its corners are supported by the support portions 10*f*. Since the peripheral portion of the diaphragm 1 is guided by the tapered projections 10*j* disposed on the internal surfaces of the sidewalls 10*b* to 10*e*, the corners of the diaphragm 1 are precisely disposed on the support portions 10*f*. In particular, by providing the tapered projections 10*j*, the clearance between the diaphragm 1 and the case 10 is reduced to be less than the insertion accuracy of the diaphragm 1, such that the size of the product is reduced. Also, since the contact area between the projections 10*j* and the diaphragm 1 is small, the vibration of the diaphragm 1 is not substantially inhibited.

Figure 7:
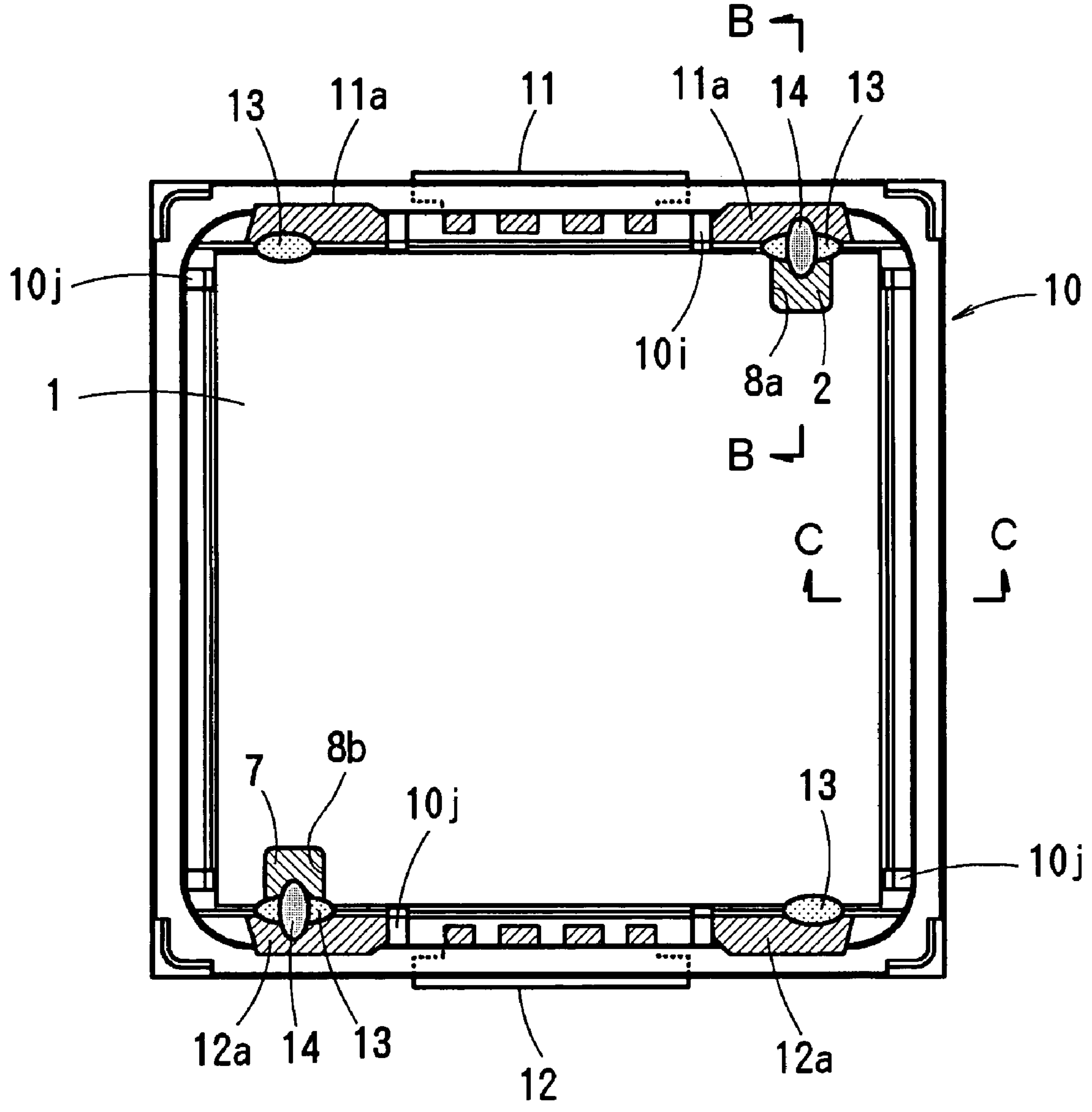
FIG. 7 is a plan view showing a state that a diaphragm is held to the case shown in FIG. 4 (before application of a second elastic adhesive)
Figure 8:
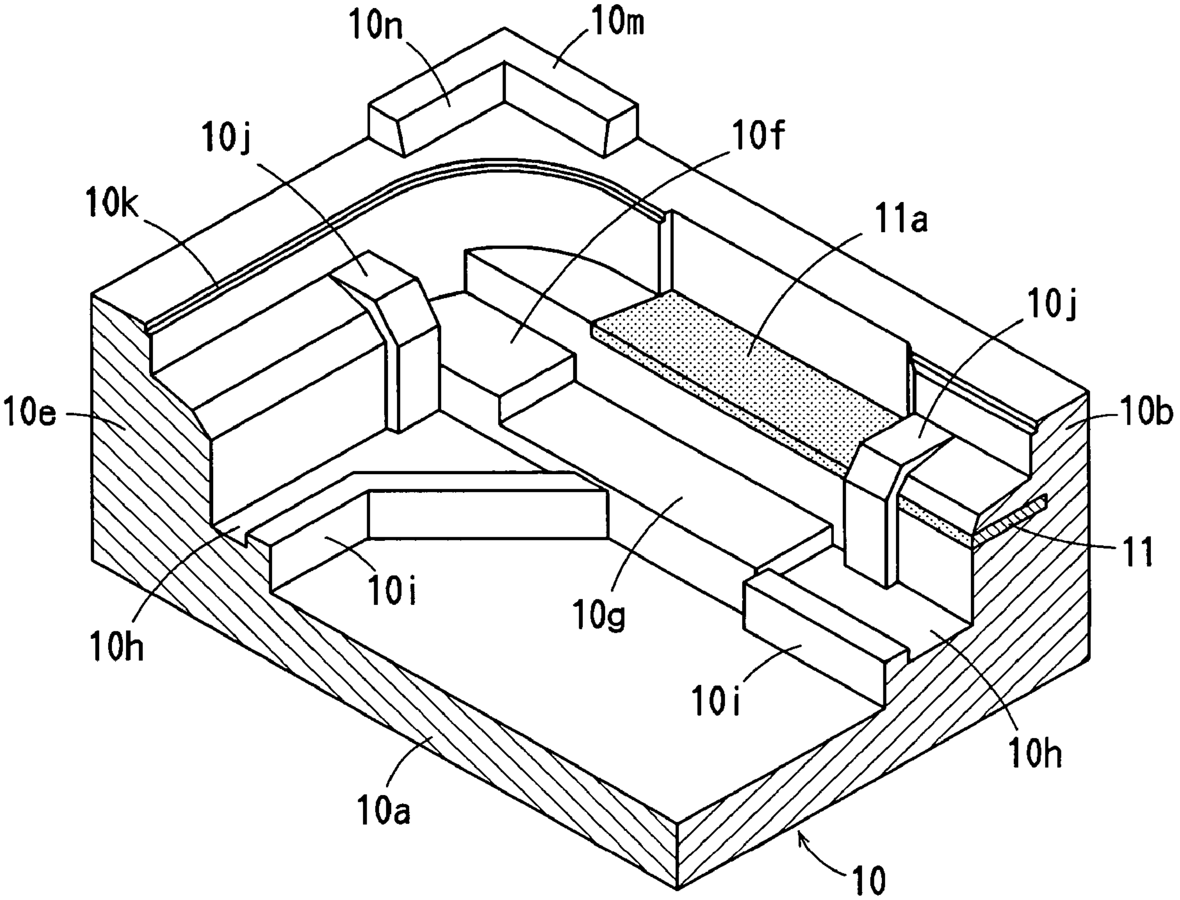
FIG. 8 is an exploded perspective view of a corner portion of the case shown in FIG. 4.
Figure 11:
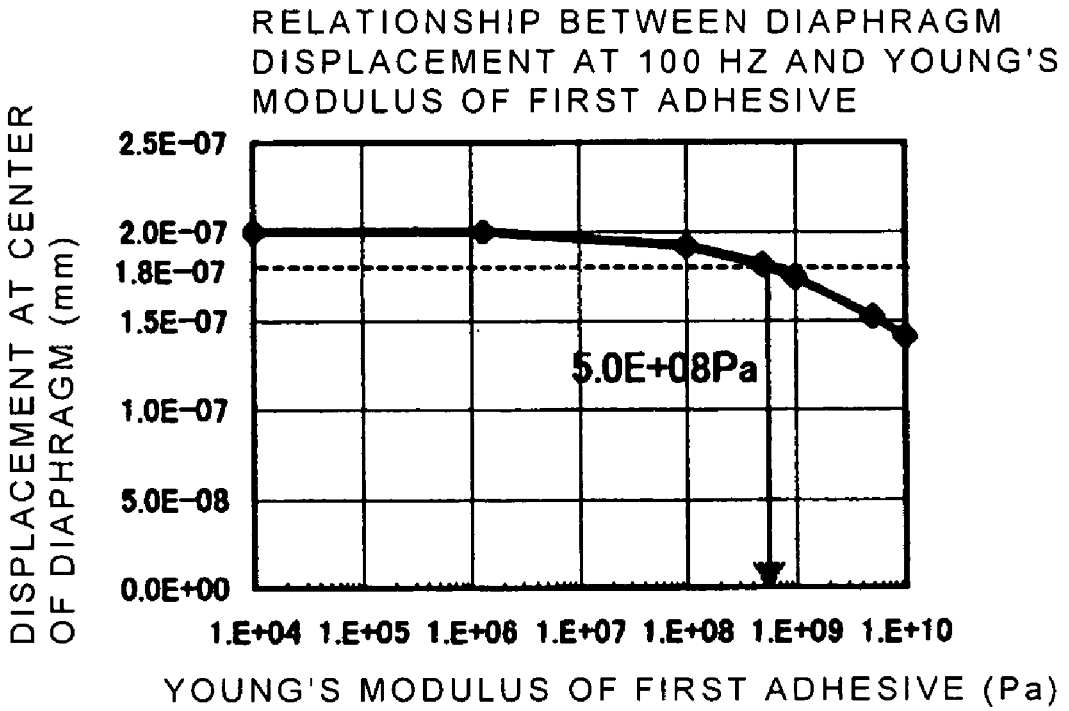
FIG. 11 is a drawing showing the relationship between diaphragm displacement and the Young's modulus of a first elastic adhesive.

After the diaphragm 1 is accommodated within the case 10, as shown in FIG. 7, the diaphragm 1 is held to the internal connection portions 11*a* and 12*a* of the terminals 11 and 12 by applying the first elastic adhesive 13 to four points of the diaphragm 1. That is, a first portion between the principal-plane electrode 2 exposed on the cut-out 8*a* and the one internal connection portion 11*a* of the terminal 11, and a second portion, which is located diagonally to the first portion, between the auxiliary electrode 7 exposed on the cut-out 8*b* and the other internal connection portion 12*a* of the terminal 12 are coated with the first elastic adhesive 13. Also, the remaining two portions located diagonally are coated with the first elastic adhesive 13. According to the present preferred embodiment, the first elastic adhesive 13 is applied in an elliptical shape or an oval shape. However, the application shape is not limited thereto. The first elastic adhesive 13 preferably has a Young's modulus of about $500\times10^6$ Pa after cured, which is relatively low. The range of the Young's modulus of the first elastic adhesive, as is understood from FIG. 11 showing the relationship between the displacement of the diaphragm center and the Young's modulus of the first elastic adhesive 13 after cured, is selected such that the displacement of the diaphragm 1 is not substantially restricted. According to the present preferred embodiment, a urethane adhesive having a Young's modulus of about $3.7\times10^6$ Pa is preferably used. The first elastic adhesive 13 is heated and cured after being applied.

Figure 9:
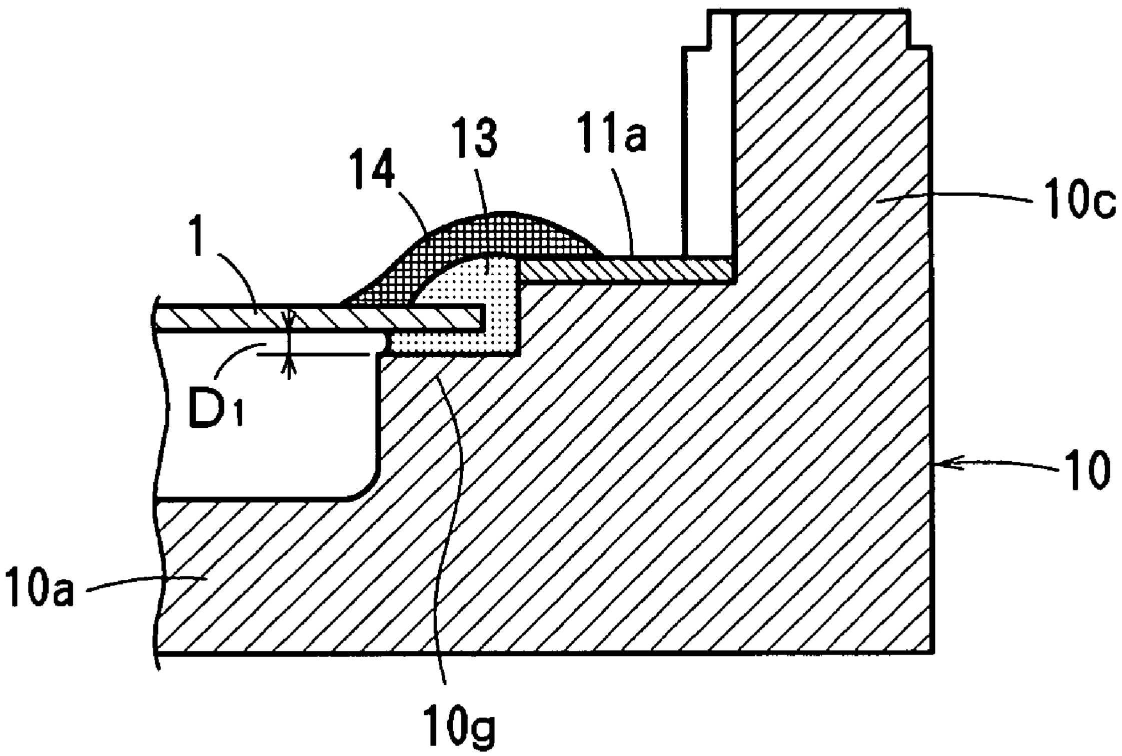
FIG. 9 is an exploded sectional view at the line B—B of FIG. 7.

When the first elastic adhesive 13 is applied, because of its low viscosity, the first elastic adhesive 13 may flow down passing through a clearance between the diaphragm 1 and the terminals 11 and 12. However, as shown in FIG. 9, the cradle 10*g* is provided under the diaphragm 1 in the vicinity of where the first elastic adhesive 13 is applied so as to have the small clearance D1 between the cradle 10*g* and the diaphragm 1, such that the first elastic adhesive 13 is prevented from flowing toward the bottom wall 10*a* by the surface tension between the cradle 10*g* and the diaphragm 1. Moreover, since the clearance D1 is rapidly filled, the excessive first elastic adhesive 13 rises between the diaphragm 1 and the terminals 11 and 12. Because a layer of the first elastic adhesive 13 exists between the cradle 10*g* and the diaphragm 1 corresponding to the clearance D1, the piezoelectric diaphragm 1 is not substantially restricted.

After the first elastic adhesive 13 is cured, a conductive adhesive 14 is applied in an elliptical shape or an elongated shape so as to intersect on the first elastic adhesive 13. The conductive adhesive 14 is not particularly limited, and according to the present preferred embodiment, a urethane conductive paste with a Young's modulus of about $0.3\times10^9$ Pa is preferably used. After the conductive adhesive 14 is applied, the principal-plane electrode 2 and the internal connection portion 11 a of the terminal 11 as well as the auxiliary electrode 7 and the internal connection portion 12*a* of the terminal 12 are respectively connected together by heating and curing the conductive adhesive 14. The conductive adhesive 14 is not limited to the elliptical coating shape as long as the principal-plane electrode 2 and the internal connection portion 11*a* as well as the auxiliary electrode 7 and the internal connection portion 12*a* are respectively connected together via the upper surface of the first elastic adhesive 13. Since the first elastic adhesive 13 rises, the conductive adhesive 14 is provided on the first elastic adhesive 13 in an arch shape so as to detour the shortest route (see FIG. 9). Therefore, the contraction stress caused by the cured conductive adhesive 14 is alleviated by the first elastic adhesive 13 so as to minimize any adverse effects on the diaphragm 1.

Figure 12:
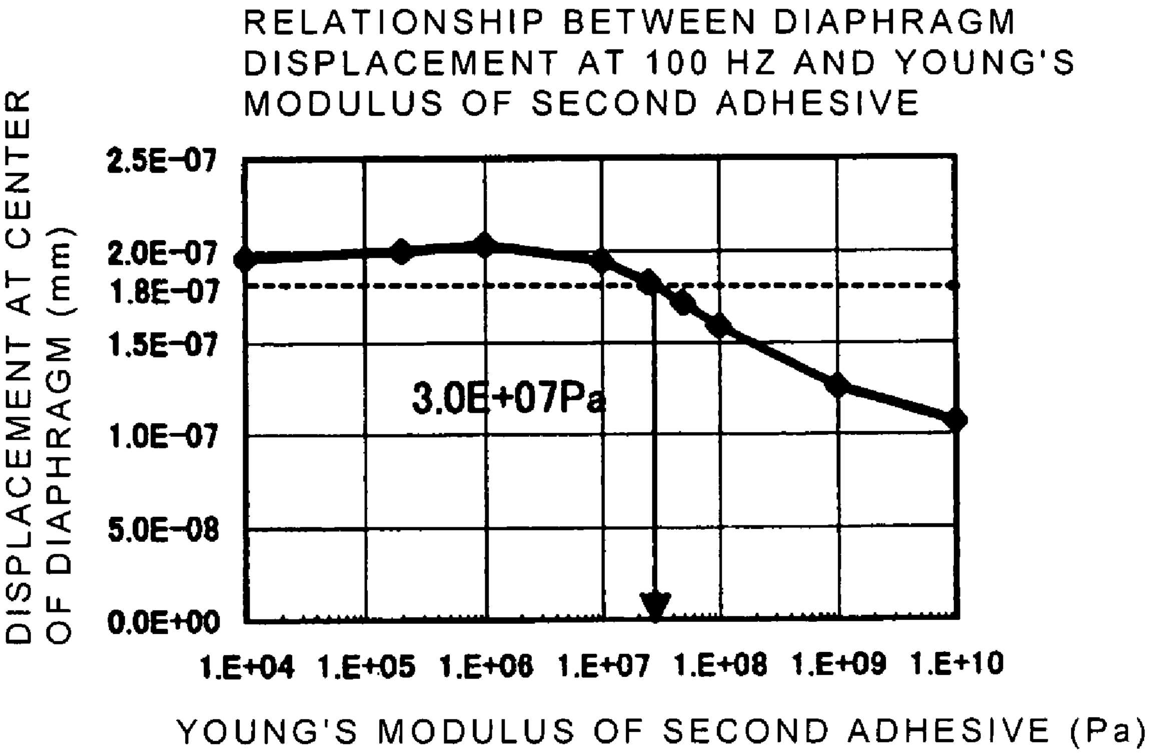
FIG. 12 is a drawing showing the relationship between diaphragm displacement and the Young's modulus of a second elastic adhesive.
Figure 13:
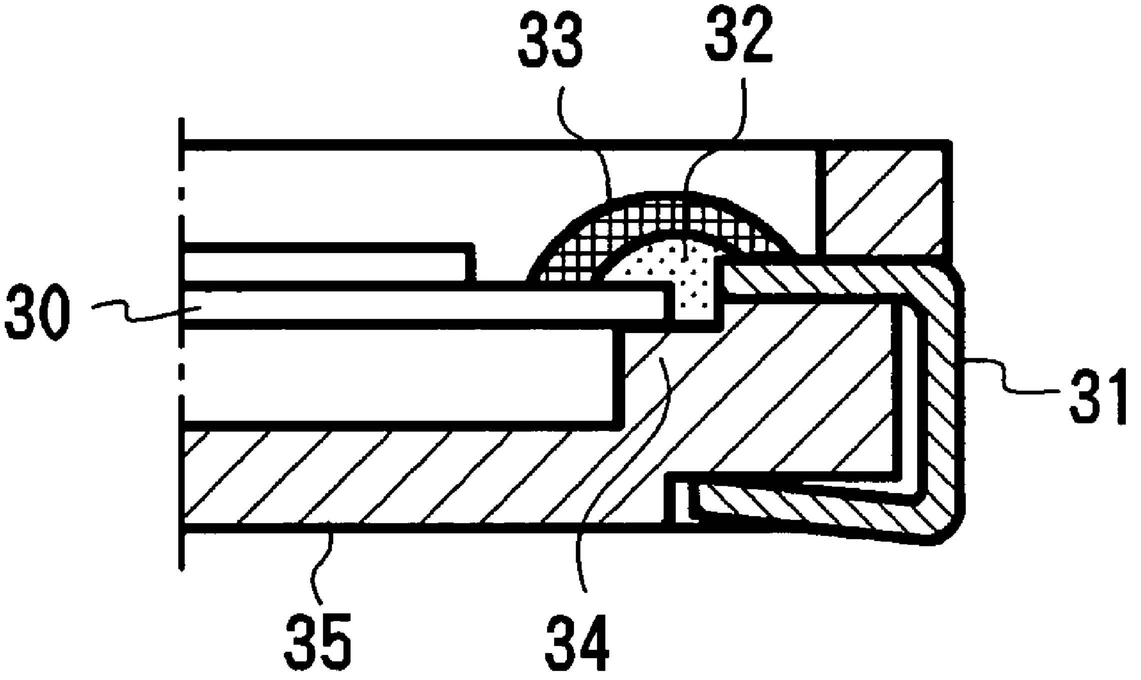
FIG. 13 PRIOR ART
FIG. 13 is a sectional view of a connection portion between the piezoelectric diaphragm and a terminal in Japanese Unexamined Patent Application Publication No. 2003-9286.
Figure 14:
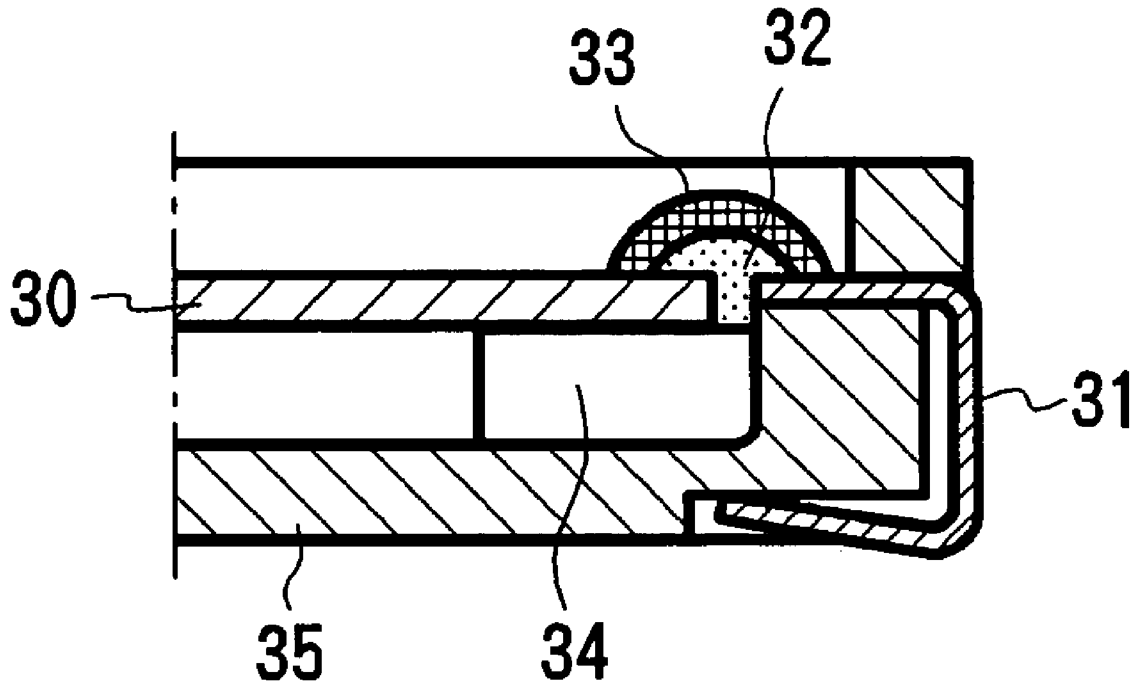
FIG. 14 PRIOR ART
FIG. 14 is a sectional view of a connection portion between the piezoelectric diaphragm and a terminal in Japanese Unexamined Patent Application Publication No. 2003-23696.

After applying the conductive adhesive 14, a clearance between the entire periphery of the diaphragm 1 and the internal periphery of the case 10 is coated with the second elastic adhesive 15 so as to prevent air leakage through the top and bottom surfaces of the diaphragm 1. After the second elastic adhesive 15 is annularly applied, it is heated and cured. As the second elastic adhesive 15, a thermo-setting adhesive with a small Young's modulus of about $30\times10^6$ Pa or less after cured and with a low viscosity of about 0.5 Pa·s to 2 Pa·s before cured is used. This range, as is understood from FIG. 12 showing the relationship between the displacement of the diaphragm center and the Young's modulus of the second elastic adhesive 15 after cured, is selected such that the second elastic adhesive 15 does not adversely affect the displacement of the diaphragm 1. According to the present preferred embodiment, a silicone adhesive having a Young's modulus of about $3.0\times10^5$ Pa is preferably used.

Figure 10:
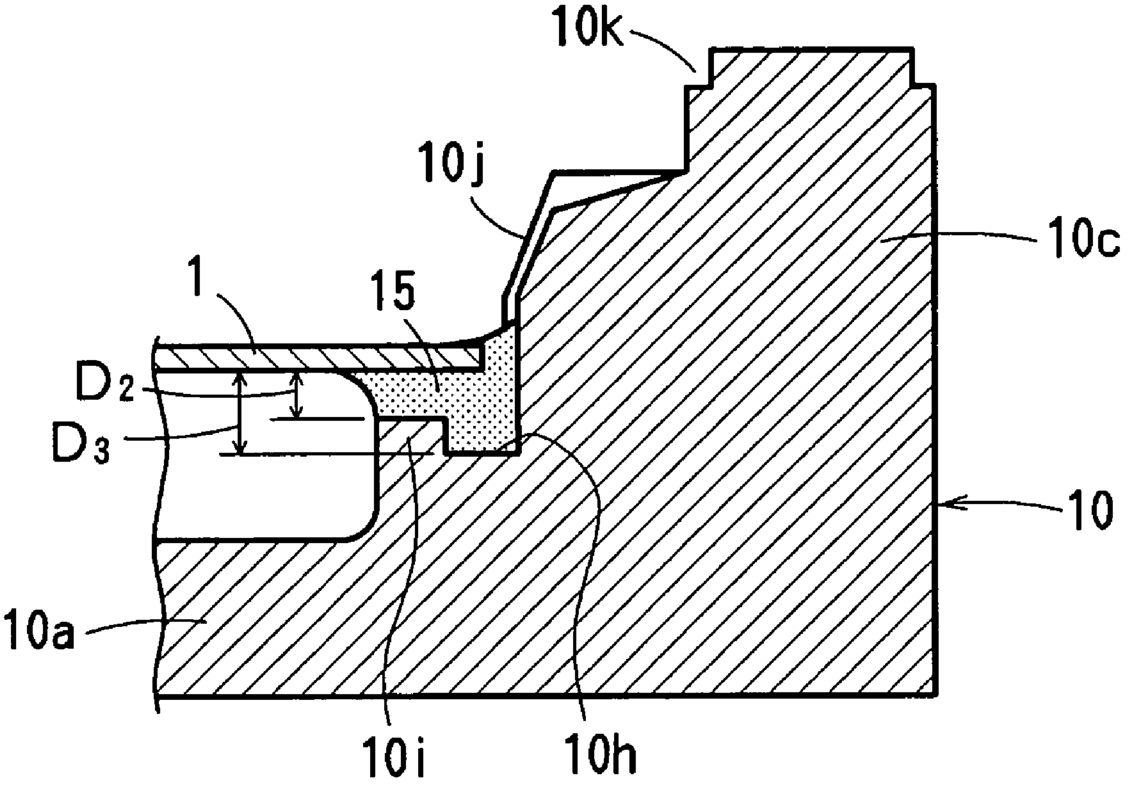
FIG. 10 is an exploded sectional view at the line C—C of FIG. 7.

When the second elastic adhesive 15 is applied, because of its low viscosity, the second elastic adhesive 15 may flow down toward the bottom wall 10*a* passing through the clearance between the diaphragm 1 and the case 10. However, as shown in FIG. 10, the groove 10*h* is provided in the internal periphery of the case 10 for being filled with the second elastic adhesive 15 and the anti-flowing wall 10*i* disposed inside the groove 10*h*, such that the second elastic adhesive 15 enters the groove 10*h* so as to pervade the periphery. Since between the diaphragm 1 and the anti-flowing wall 10*i*, the clearance D2 is provided, the second elastic adhesive 15 is prevented from flowing down toward the bottom wall 10*a* by the surface tension between the diaphragm 1 and the anti-flowing wall 10*i*. Because a layer of the second elastic adhesive 15 exists between the wall 10*i* and the diaphragm 1 corresponding to the clearance D2, the vibration of the piezoelectric diaphragm 1 is prevented from being restricted.

According to the preferred embodiment, the clearance D2 is slightly greater than the clearance D1 (D1=about 0.15 mm, D2=about 0.20 mm). The reason for this is that while the first elastic adhesive 13 is partially applied between the diaphragm 1 and the terminals 11 and 12 opposing each other, the second elastic adhesive 15 is applied around substantially the entire periphery of the diaphragm 1, such that in order to minimize the restriction force to the diaphragm 1 by the second elastic adhesive 15, the clearance D2 is increased as much as possible within a range that prevents the second elastic adhesive 15 from flowing out. On the other hand, since the coating location of the first elastic adhesive 13 is limited in the clearance D1, the influence of the restriction force is small even if the clearance D1 is reduced, such that the clearance D1 is set so as to raise the first elastic adhesive 13 with an amount as small as possible between the diaphragm 1 and the terminals 11 and 12.

When applying the second elastic adhesive 15, a portion of the second elastic adhesive 15 climbs up the sidewalls 10*b* to 10*e* of the case 10 so as to possibly adhere on the top surfaces of the sidewalls. In the case where the second elastic adhesive 15 is a mold-releasing sealant such as a silicone adhesive, the adhesive strength between the lid 20 and the top surfaces of the sidewalls 10*b* to 10*e* may be reduced. However, the recess 10*k* is provided in the internal upper peripheries of the sidewalls 10*b* to 10*e* to restrict the second elastic adhesive 15 from climbing up, which prevents the second elastic adhesive 15 from adhering on the top surfaces of the sidewalls.

After the diaphragm 1 is attached to the case 10 as described above, the lid 20 is fixed on the top surfaces of the sidewalls with an adhesive 21. The adhesive 21 may be a known adhesive such as epoxy. However, where the second elastic adhesive 15 is a silicone adhesive, there is a possibility that a film caused by siloxane gas adheres on the top surfaces of the sidewalls, such that a silicone adhesive may be used as the adhesive 21. The lid 20 is a flat plate made of the same material as that of the case 10. The periphery of the lid 20 is brought into engagement with, the tapered surfaces 10*n* of the positioning projections 10*m* protruded from the top surfaces of the sidewalls of the case 10, and is precisely located. By bonding the lid 20 to the case 10, an acoustic space is provided between the lid 20 and the diaphragm 1. The lid 20 is provided with a second sound-releasing opening 22 provided therein.

In such a manner, a surface-mount piezoelectric electro-acoustic transducer is completed.

In the electro-acoustic transducer according to the present preferred embodiment, by applying a predetermined alternating voltage (AC signal or rectangular-wave signal) between the terminals 11 and 12, the diaphragm 1 is vibrated in a surface flexural mode. The piezoelectric ceramic layer, in which the polarizing direction is the same as the electric-field direction, contracts in a plane direction while a piezoelectric ceramic layer, in which the polarizing direction is opposite to the electric-field direction, expands in the plane direction, such that the piezoelectric ceramic layer is deformed in the thickness direction as a whole.

According to the preferred embodiment, since the diaphragm 1 is a layered structure such as a bimorph structure, in which two vibration regions (ceramic layers) sequentially arranged in the thickness direction reciprocally vibrate in the opposite direction, a large displacement, i.e., a large sound pressure, is obtained as compared to a unimorph diaphragm.

The present invention is not limited to the preferred embodiments described above, and modifications can be made within the scope of the present invention.

The coating region with the second elastic adhesive is not limited to the entire periphery of the diaphragm 1 as in the preferred embodiments described above, and the second elastic adhesive may be applied in a region suitable for sealing the clearance between the diaphragm 1 and the case 10.

The diaphragm 1 according to the above preferred embodiments is preferably constructed to include two piezoelectric ceramic layers. Alternatively, the diaphragm may include three or more layers.

The piezoelectric diaphragm is not limited to the layered piezoelectric ceramic structure, and a known unimorph or bimorph diaphragm may be used, in which a piezoelectric plate is bonded on one surface or both surfaces of a metallic plate.

The casing according to the present invention is not limited to the structure according to the preferred embodiments that includes the convex-sectional case 10 and the lid 20 to be bonded on the upper opening of the case 10, and the casing may have a structure including a cap-like case having an opening formed on the bottom surface and a substrate boded on the bottom surface.

The present invention is not limited to the above-described preferred embodiments, but can be modified in the scope of the attached claims. Further, the technologies disclosed in the above-described preferred embodiments can be used in combination, as desired.

What is claimed is:

1. A piezoelectric electro-acoustic transducer comprising:

a substantially rectangular piezoelectric diaphragm that vibrates in a surface-flexural mode in the thickness direction of the diaphragm in response to application of an alternating signal between electrodes disposed thereon;

a casing having a support unit disposed in an internal periphery thereof for supporting four corners of the piezoelectric diaphragm;

a terminal fixed to the casing such that an internal connection portion of the terminal is exposed in the vicinity of the support unit;

a first elastic adhesive for holding the piezoelectric diaphragm to the casing and arranged between an external periphery of the piezoelectric diaphragm and the internal connection portion;

a conductive adhesive for electrically connecting an electrode of the piezoelectric diaphragm and the internal connection portion of the terminal and being arranged between the electrodes of the piezoelectric diaphragm and the internal connection portion of the terminal via the upper surface of the first elastic adhesive; and a second elastic adhesive for sealing between the external periphery of the piezoelectric diaphragm and the internal periphery of the casing; wherein a cradle is provided in the internal periphery of the casing and below the piezoelectric diaphragm in the vicinity of the first elastic adhesive to provide a gap for preventing a flow of the first elastic adhesive, the first elastic adhesive is located at a position lower than the support unit and between an upper surface of the cradle and a bottom surface of the piezoelectric diaphragm.

2. A transducer according to claim 1, wherein the casing is provided with a groove disposed in the internal periphery for receiving the second elastic adhesive, and an anti-flowing wall is disposed at a position lower than a support unit within the internal periphery of the groove for restricting the second elastic adhesive from flowing toward the bottom wall of the casing.

3. A transducer according to claim 1, wherein the first elastic adhesive has a Young's modulus of about $500\times10^6$ Pa or less after being cured and the second elastic adhesive has a Young's modulus of about $30\times10^6$ Pa or less after being cured.

4. A transducer according to claim 1, wherein the first elastic adhesive is a urethane adhesive and the second elastic adhesive is a silicone adhesive.

5. A transducer according to claim 1, wherein the gap between the upper surface of the cradle and the bottom surface of the piezoelectric diaphragm has a size which prevents a flow of the first elastic adhesive by a surface tension of the first elastic adhesive between the cradle and the bottom surface of the piezoelectric diaphragm.

6. A transducer according to claim 2, wherein a clearance between the upper surface of the anti-flowing wall and the bottom surface of the piezoelectric diaphragm has a size which prevents a flow of the second elastic adhesive by a surface tension of the second elastic adhesive between the anti-flowing wall and the bottom surface of the piezoelectric diaphragm.

7. A transducer according to claim 1, wherein the piezoelectric diaphragm is a bimorph diaphragm including at least two piezoelectric ceramic layers, an internal electrode disposed between the at least two piezoelectric ceramic layers and principal plane electrodes provided on top and bottom surfaces of the at bimorph diaphragm.

8. A transducer according to claim 7, wherein the principal plane electrodes have a length that is less than a length of the piezoelectric ceramic layers.

9. A transducer according to claim 7, wherein the bimorph diaphragm includes end surface electrodes, said internal electrode being connected to one of said end surface electrodes, and said principal plane electrodes being connected to another of said end surface electrodes.

10. A transducer according to claim 1, wherein said diaphragm includes protection films provided on top and bottom surfaces of the diaphragm.

* * * * *